United States Patent
Roitman et al.

(10) Patent No.: US 6,627,331 B1
(45) Date of Patent: Sep. 30, 2003

(54) ELECTROLUMINESCENT DISPLAY BASED ON ELECTROCHEMICALLY DEPOSITED POLYMER FILMS AND A METHOD FOR CONSTRUCTING

(75) Inventors: Daniel B. Roitman, Menlo Park, CA (US); Seiji Inaoka, Birmingham, AL (US); Riogoberto C. Advincula, W. Hoover, AL (US)

(73) Assignee: Agilent Technologies, Inc., Palo Alto, CA (US)

( * ) Notice: Subject to any disclaimer, the term of this patent is extended or adjusted under 35 U.S.C. 154(b) by 202 days.

(21) Appl. No.: 09/401,691

(22) Filed: Sep. 22, 1999

(51) Int. Cl.[7] ............................................. H05B 33/14
(52) U.S. Cl. ........................ 428/690; 428/917; 428/704; 428/195; 313/504; 313/506; 257/40; 257/103; 257/88; 257/89; 257/90; 257/96; 427/66
(58) Field of Search .................................. 313/503, 504, 313/505, 506; 257/40, 103, 88, 89, 90, 96; 428/690, 917, 704, 195; 427/66

(56) References Cited

U.S. PATENT DOCUMENTS 5,949,188 A * 9/1999 Leising et al. .............. 313/505
6,117,567 A * 9/2000 Andersson et al. ......... 428/690

* cited by examiner

Primary Examiner—Deborah Jones
Assistant Examiner—Ling Xu

(57) ABSTRACT

A display device and a method for fabricating the display device. A display device according to the present invention is fabricated from an electrode layer that includes a plurality of electrodes on a substrate. The electrode layer is immersed in a solution of a first precursor polymer in a first solvent. The first precursor polymer includes a plurality of electrochemical polymerizable monomers. Each monomer has first and second polymer-forming active sites that can be joined by electrochemical polymerization and third and fourth polymer-forming active sites that can be joined chemically in solution. The first precursor polymer is soluble in the first solvent whereas a first polymer formed by electrochemical polymerization of the first and second polymer-forming active sites is insoluble in the first solvent. A layer of the first polymer is deposited on the a first one of the electrodes by connecting that electrode to an electric circuit while leaving the others of the electrodes disconnected from the circuit. The electrode is then immersed in a solution of said first precursor polymer. The circuit applies a potential to the electrode sufficient to cause the first and second polymer active sites to polymerize by electrochemical polymerization thereby depositing a first polymer layer includes the first polymer precursor on the first one of the electrodes. A second electrode layer is then deposited over the first polymer layer. In multi-color displays, the different polymer layers corresponding to the various colors are deposited on different ones of the electrodes by sequentially depositing each polymer layer in a similar manner.

13 Claims, 8 Drawing Sheets

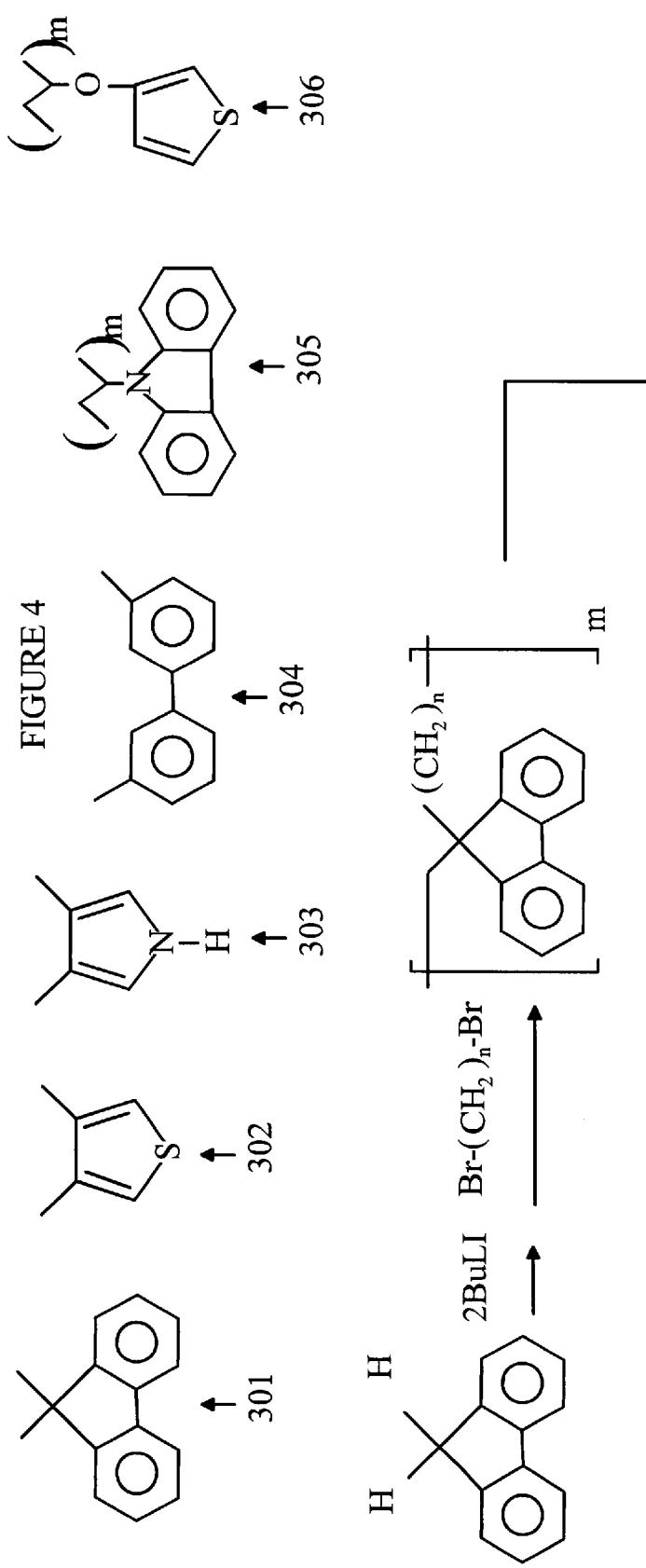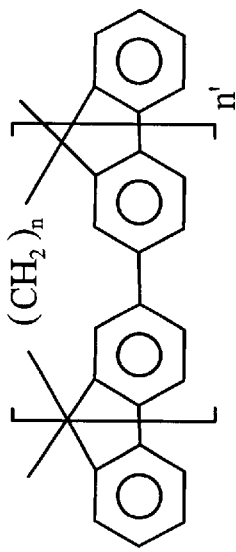
FIGURE 4
FIGURE 5

ELECTROLUMINESCENT DISPLAY BASED ON ELECTROCHEMICALLY DEPOSITED POLYMER FILMS AND A METHOD FOR CONSTRUCTING

FIELD OF THE INVENTION

The present invention relates to polymer-based electroluminescent devices, and more particularly, to display devices constructed from a class of precursors that are electrochemically polymerized to form an electrically conducting polymer that may can be used for the electroluminescent layer in such devices.

BACKGROUND OF THE INVENTION

Polymer-based electroluminescent devices (PLEDs) have the potential for providing inexpensive alternatives to alphanumeric displays and x-y addressable displays. PLEDs also have the potential to provide an alternative to back lighted, liquid crystal displays. A simple PLED may be constructed from an electroluminescent layer sandwiched between an electron injection electrode and a hole injection electrode. The electroluminescent layer is typically constructed by depositing a conjugated or conductive polymer on one of the electrodes. Devices based on poly(p-phenylenevinylene) (PPV), or derivatives thereof, have been demonstrated with sufficient quantum yields to be commercially attractive. More complicated devices utilize electron and hole transport layers between the above mentioned electrodes and the electroluminescent layer. The electroluminescent layer generates light when holes and electrons recombine in the layer.

The deposition and patterning of the electroluminescent layer present significant technical problems that must be overcome before economically attractive devices can be fabricated. If the conjugated polymer is soluble in a solvent, a thin film can be made by the spin-coating of a polymer solution. While spin-coated polymer films having good electro-optical properties can be obtained in this manner, the adhesion of spin-coated film to the underlying layer is often insufficient. In addition, many attractive polymers are not sufficiently soluble to be applied via spin-coating.

Spin-coating and other processes in which the entire substrate is coated, present additional problems in multi-color displays in which different "pixels" must be coated with different polymers. The deposition of each layer requires a three-step procedure consisting of a masking step to protect areas that are not to be coated, the spin-coating step, and a mask removal step. In addition to the increased complexity of the masking steps, the solvents utilized with conventional masking systems are often incompatible with the polymers being deposited. Accordingly, it would be advantageous to provide a system that does not require such masking operations.

Broadly, it is the object of the present invention to provide an improved method for fabricating an electroluminescent display.

It is another object of the present invention to provide a method that does not require the masking operations discussed above.

These and other objects of the present invention will become apparent to those skilled in the art from the following detailed description of the invention and the accompanying drawings.

SUMMARY OF THE INVENTION

The present invention is a display device and a method for fabricating the display device. A display device according to the present invention is fabricated from an electrode layer that includes a plurality of electrodes on a substrate. The electrode layer is immersed in a solution of a first precursor polymer in a first solvent. The first precursor polymer includes a plurality of electrochemical polymerizable monomers. Each monomer has first and second polymer-forming active sites that can be joined by electrochemical polymerization and third and fourth polymer-forming active sites that can be joined chemically in solution. The first precursor polymer is soluble in the first solvent whereas a first polymer formed by electrochemical polymerization of the first and second polymer-forming active sites is insoluble in the first solvent. A layer of the first polymer is deposited on the a first one of the electrodes by connecting that electrode to an electric circuit while leaving the others of the electrodes disconnected from the circuit. The electrode is then immersed in a solution of said first precursor polymer. The circuit applies a potential to the electrode sufficient to cause the first and second polymer active sites to polymerize by electrochemical polymerization thereby depositing a first polymer layer includes the first polymer precursor on the first one of the electrodes. A second electrode layer is then deposited over the first polymer layer. In multi-color displays, the different polymer layers corresponding to the various colors are deposited on different ones of the electrodes by sequentially depositing each polymer layer in a similar manner.

BRIEF DESCRIPTION OF THE DRAWINGS

FIG. 4 shows some examples of monomeric functional groups that may be utilized to form the precursor polymers of the present invention.

FIG. 5 illustrates the preparation of one class of electroluminescent polymers according to the present invention.

DETAILED DESCRIPTION OF THE INVENTION

Figure 1:
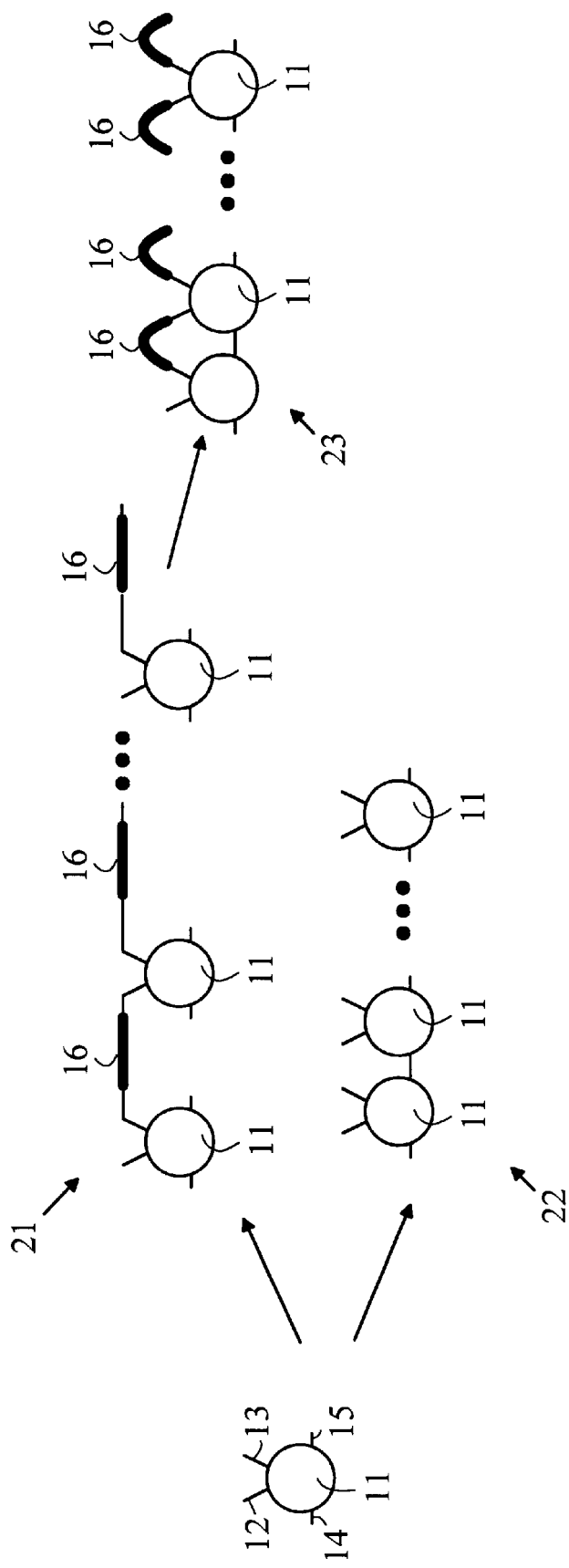
FIG. 1 illustrates the polymerization of monomer units via two different processes.

The manner in which the present invention achieves its advantages may be more easily understood with reference to FIG. 1, which is a schematic drawing of the polymerization of monomer units 11 via two different processes. Monomer 11 is chosen such that it has four functional groups that can be utilized to form polymers. Groups 12 and 13 can be linked with the aid of a spacer 16 to form a polymer 21 that is soluble in a predetermined solvent, but which is neither conducting nor electroluminescent. Groups 14 and 15 can be linked via electrochemical polymerization to form either an electroluminescent or electrically conducting polymer 22, which is insoluble in the solvent. Since polymer 22 is insoluble, the number of units that can be linked electrochemically is limited. As a result, the quality of polymer films obtained by electrochemical polymerization groups 14 and 15 leaves much to be desired. In many cases, the film consists of a layer of powdery material that is precipitated in the vicinity of the electrode rather than being deposited onto the electrode. This precipitation problem results from the poor solubility of polymer units having a few monomers linked together that are formed in the vicinity of the electrode. Attempts to overcome this problem by utilizing parent monomers with flexible-side groups to increase the solubility of short chain polymer units have not yielded films of a quality needed for electronic devices. In addition, this approach also has a disadvantage of reducing the concentration of electroactive functional groups in the film structure, and hence, the efficiency of light generation by the films.

The present invention avoids the problems associated with polymer 22 by utilizing polymer 21 as the precursor for forming an electrically conducting or electroluminescent polymer 23 by electrochemical polymerization of polymer 21. The spacers 16 in polymer 21 provide a high degree of connectivity to the moieties contain groups 13 and 14, and hence, result in the deposited film having a higher degree of mechanical strength and uniformity than the films obtained by direct electrochemical polymerization of the unlinked moieties. As a result, the polymer is deposited on the electrode and can grow into a high quality film.

Figure 2:
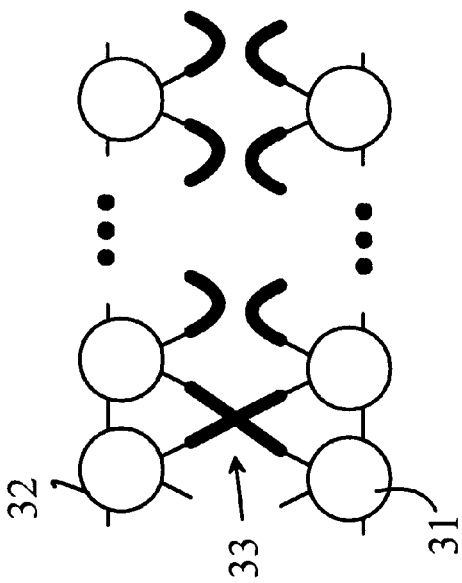
FIG. 2 is an example of a flexible spacer cross-linking between two chains of monomers.

The film formed during the electrochemical polymerization may be two-dimensional, or even, three-dimensional because of the cross-linking of the various one-dimensional polymer chains. The cross-linking occurs through the sites used to link the flexible spacers or through the electroluminescently active sites. An example of a flexible spacer cross-linking between two chains 31 and 32 is shown in FIG. 2. The cross-link is shown at 33. This type of cross-linked structure is formed during the preparation of the precursor polymers. In this case, the pi-conjugated bonds are formed during electrochemical polymerization between monomers in the same chain.

Figure 3:
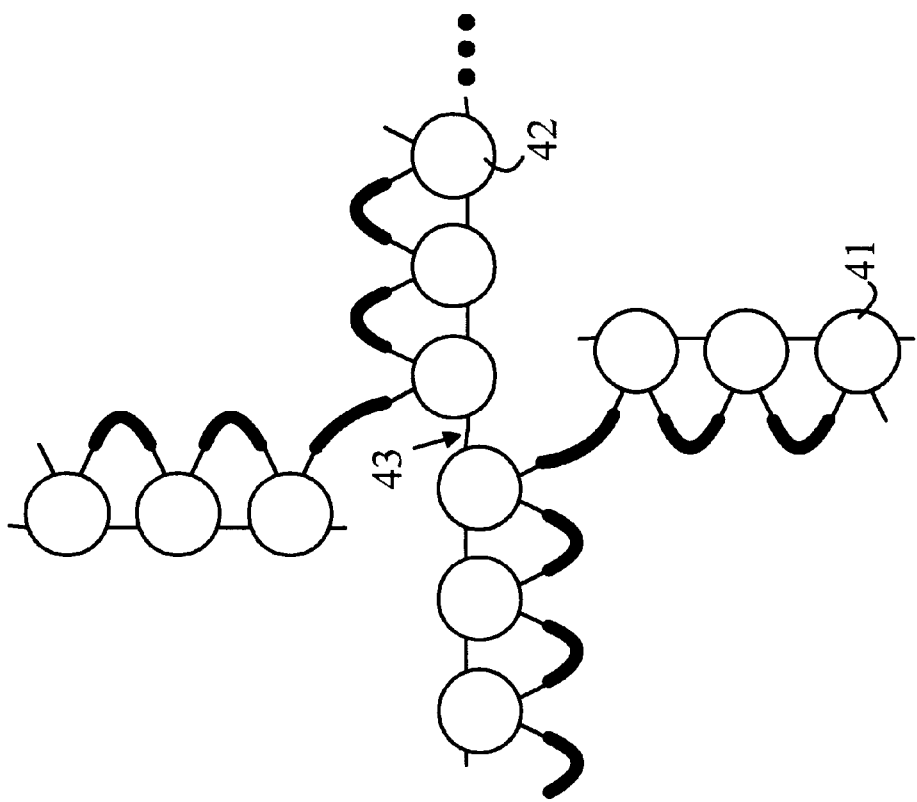
FIG. 3 is an example of a cross-linking between two chains of monomers via an electroluminescent active site.

An example of a cross-linking between two chains 41 and 42 via a pi-conjugated bond 43 is shown in FIG. 3. In this case, the chains are linked during the electrochemical polymerization. It will also be apparent from the previous discussion that more complex arrangements may be formed in which two or three-dimensional chains are further cross-linked during either the original polymerization using the flexible spacers or the electrochemical polymerization.

Some examples of monomeric functional groups that may be utilized to form the precursor polymers are shown in FIG. 4 at 301–306. Compounds 301–306 are fluorene, triophene, pyrrol, biphenyl, poly(vinyl carbazole) and poly (vinyl oxy thiophene), respectively. These groups may be joined by spacers of the form $(CH_2)_n$, $(OCH_2)_n$, $(OCH_2CH_2)$, . . . , where $1<n<20$.

Refer now to FIG. 5, which illustrates the preparation of one class of electroluminescent polymers according to the present invention. A series of precursor polymers was prepared by dilithiation of fluorene with n-butyllithium, followed by the reaction with α, ω-dibromoalkanes (n=4,6,8, 10,12). The formed precursor polymers are soluble in common organic solvents such as chloroform, dichloromethane or toluene.

Electrochemical polymerization is carried out using solutions of precursor polymers at a concentration of 50 mM with electrolyte (tetrabutylammonium tetrafluoroborate: 100 mM) in dichloromethane as a solvent. Conductive glass substrates with a thin layer of indium-tin oxide may be used as working electrodes. Cyclic voltammetry is performed for each precursor polymer solution, between −200 mV and +2000 mV (versus Ag/Ag+ reference electrode). At the first cycle, the oxidation of the fluorene group is observed at +1350 mV. At the following cycles, reversible oxidation and reduction is observed at around +1200 mV, and the change in color of the material on the electrode is observed (light brown at low potential, bright red at high potential). After the film has reached the desired thickness, the electrodes are rinsed with toluene, which is a good solvent for these precursor polymers to remove any non-electrochemically polymerized precursor polymers. A thin film of a light-brown material remains on the electrode surface. This film exhibits an absorbence spectra that is very close to that of poly(fluoren-2,7-diyl).

Figure 6:
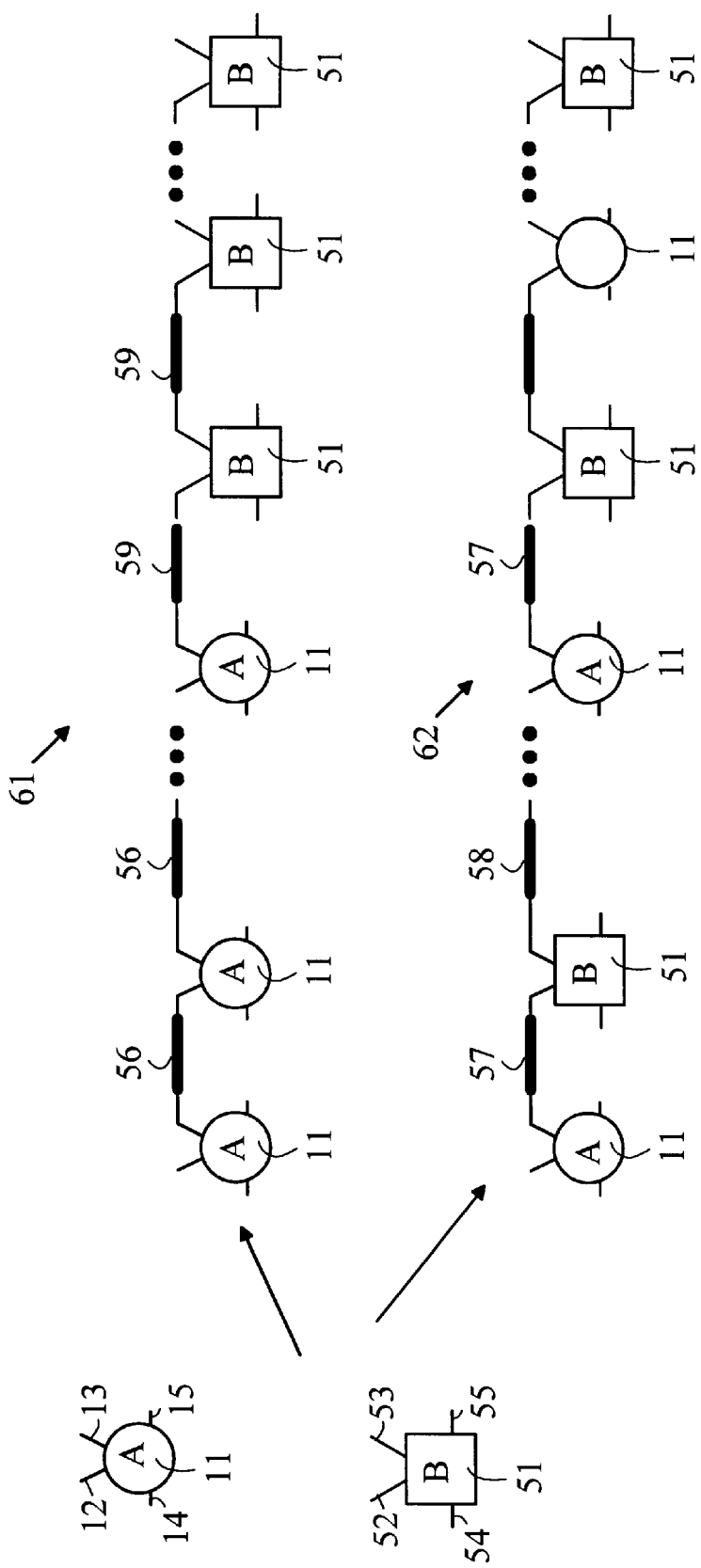
FIG. 6 is a schematic representation of two possible polymers formed from monomers labeled A and B.

The precursors of the present invention can also be utilized to form films of copolymers from monomers having different electronic characteristics, such as emission spectra and energy bands. Refer now to FIG. 6, which is a schematic representation of two possible polymers formed from monomers labeled A and B. To simplify the discussion, unit A is assumed to be the same as monomer unit 11 shown in FIG. 1. Unit B, which is shown at 51, also has two active sites, 52 and 53, that may be used to polymerize the monomers to form a soluble chain that does not emit light and two active sites, 54 and 55, that can be joined via electrochemical polymerization to form a light emitting polymer that is insoluble in the solvent. The monomeric units can be combined to form a soluble copolymer precursor in a number of different configurations. For example, a precursor block copolymer 61 can be generated by combining the A units via spacer 56 to form a poly-A precursor that is then joined to a poly-B precursor formed by joining the B monomers via spacers 59. Similarly, the two sub-units can be joined via a spacer 57 to form the alternating copolymer precursor 61. A second configuration for the electrochemical polymerization precursor is shown at 62. In this case, a dimer consisting of one A-unit and one B-unit is first formed. The dimers are then polymerized with the aid of spacers 58 to form the alternative copolymer precursor.

While the examples shown in FIG. 6 utilize different spacers, it will be obvious to those skilled in the art from the preceding discussion that the monomers may be chosen such that a single spacer unit can be utilized for all of the sub-unit attachments. A random copolymer precursor polymer may be constructed by applying the solution polymerization process to a solution containing both monomers. It will also be apparent form the preceding discussion that precursors having more than two types of monomers may also be constructed in this manner. For example, the monomeric functional groups can be two or more of any electrochemically polymerizable group such as fluorene, thiophene, pyrrole, phenylene, pyridine, or triptycene or one of the derivatives of the above compounds. Component of each species can be between 0.001% and 99.999%.

The precursor copolymer can have any form of structure including alternative copolymer, block copolymer, graft copolymer and random copolymer. Furthermore, the precursors can form complex two and three-dimensional structures as discussed above. The functional groups can be either linked by a spacer or simply attached to a polymer backbone. The spacer or polymer backbone can be any flexible molecular chains such as oligomethylene units or oligooxymethylene units, or it may contain functional groups such as phenyl group or amino group. The number of repeating units either in the spacer or between electroactive functional groups is preferably between 1 and 20.

Figure 7:
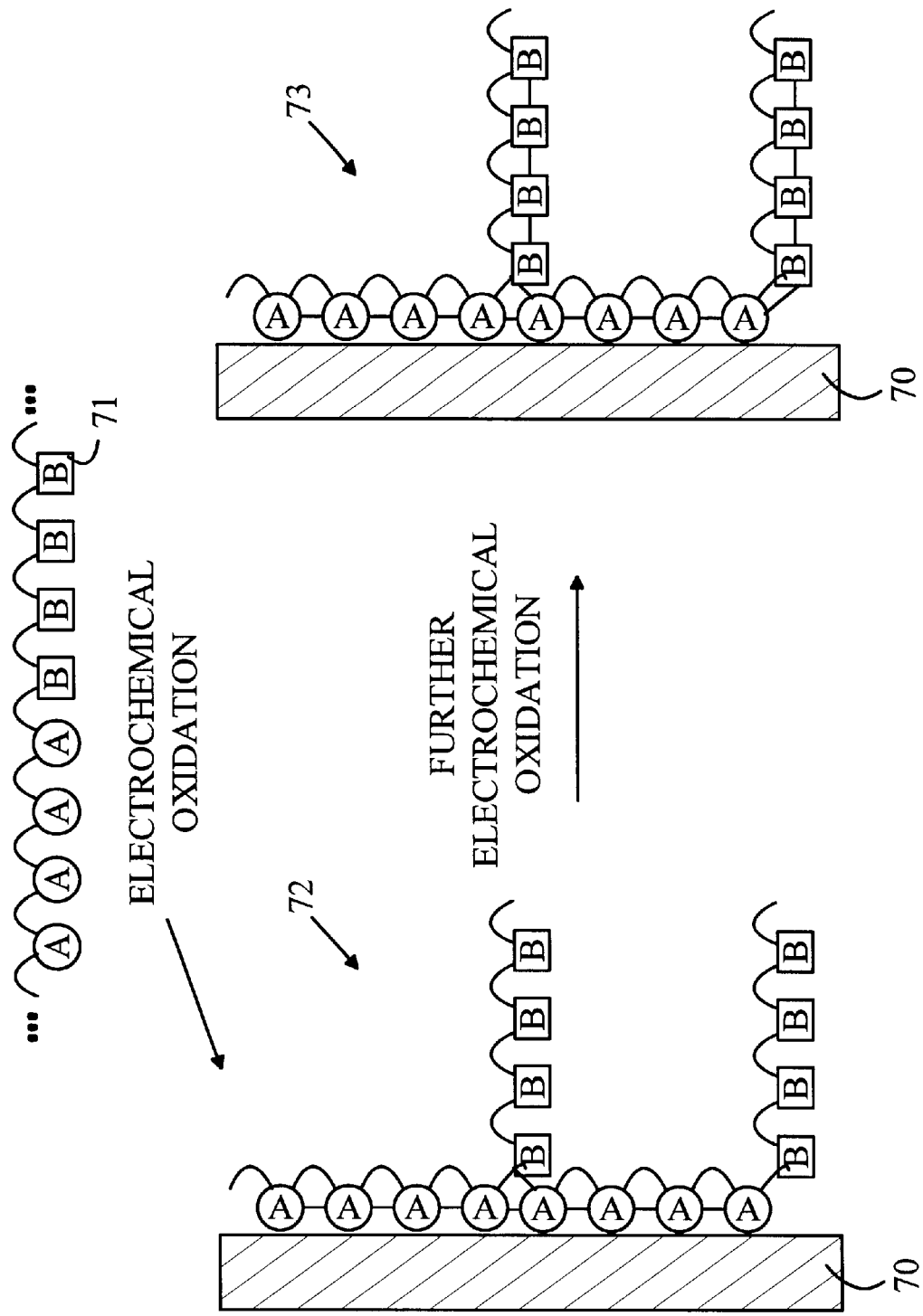
FIG. 7 illustrates the electrochemical polymerization of a precursor polymer having the configuration shown at 61 in FIG. 6 on an electrode.

Once the precursor polymer is prepared, the precursor polymer is dissolved in a solvent with an electrolyte. A cyclic voltammogram or a bulk electrolysis can be carried out for this solution. By choosing the appropriate potential of the electrode for each functional unit, the precursor polymer is polymerized and deposited on the electrode. Refer now to FIG. 7, which illustrates the electrochemical polymerization of a precursor polymer having the configuration shown at 61 in FIG. 6 on an electrode 70. For the purposes of this discussion, it will be assumed that the A-subunit has a lower oxidation potential than the B-subunit. Hence, the A-subunits will be joined at the lower potential difference between the electrode on which the film is deposited and the reference electrode. This leads to a film in which the A-subunits are polymerized as shown at 72 in FIG. 7. When all of the A-subunits have been polymerized, the B-subunits will then be oxidized to form the polymer shown at 73.

Figure 8:
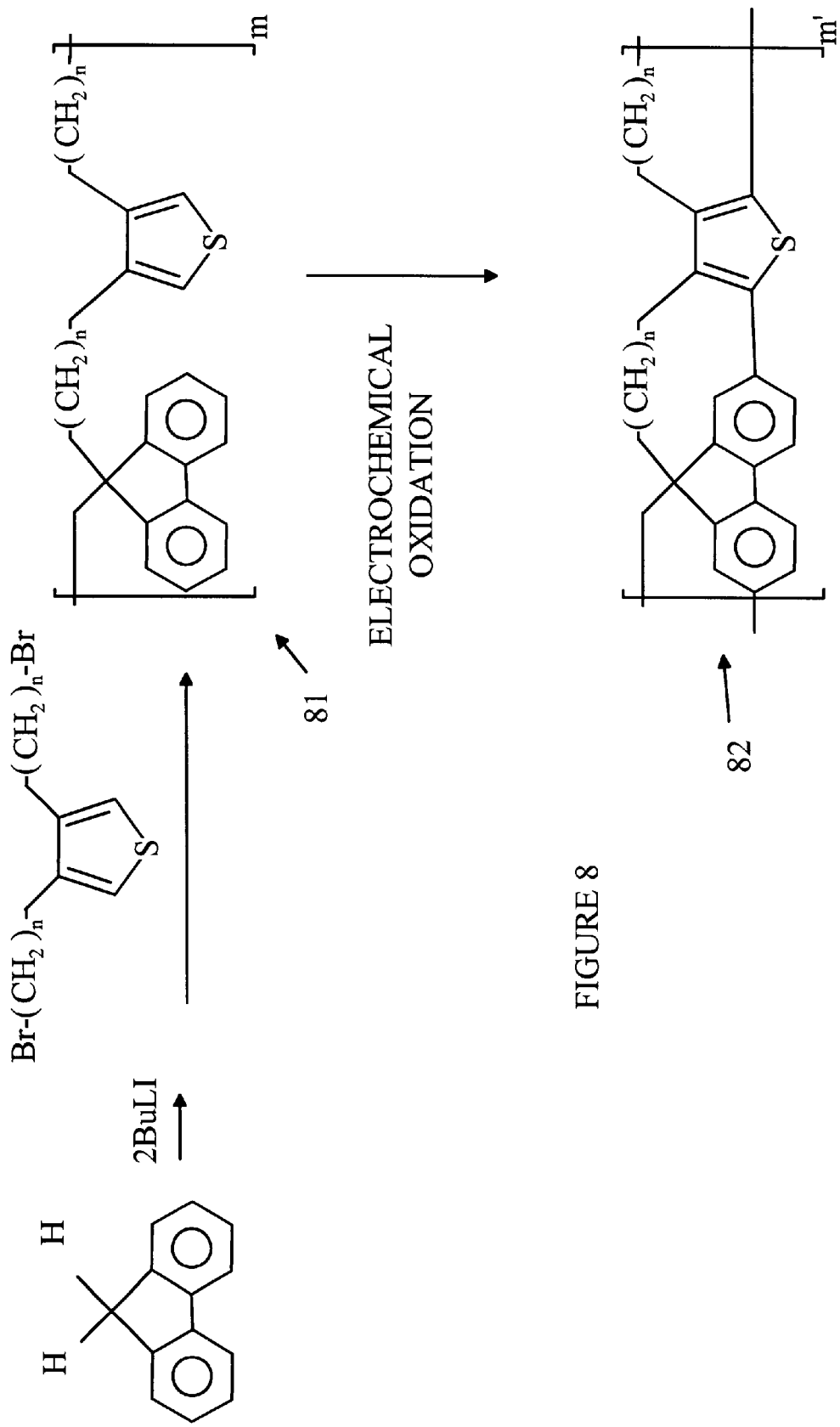
FIG. 8 is an example of the formation of an electroluminescent polymer layer based on a dimer unit such as shown in FIG. 6.

An electroluminescent polymer layer based on a dimer unit such as shown in FIG. 6 at 62 may be formed in the manner shown in FIG. 8. A precursor polymer 81 is prepared by dilithiation of fluorene with n-butyllithium, followed by the reaction with 3,4 bis($\omega$-bromoalkyl) thiophene. Polymers with n=4,6,8,10,12 can be utilized; however, precursors with other n values may also be useful. The formed precursor polymers are soluble in common organic solvents such as chloroform, dischloromethane, or toluene. The resulting electroluminescent film emits light in the yellow-green region of the optical spectrum.

Electrochemical polymerization can then be carried out using solutions of precursor polymers at a typical concentration of 50 mM in dichloromethane as a solvent to which an electrolyte (tetrabutylammonium tetrafluoroborate: 100 mM) has been added. Conductive glass substrates with a thin layer of indium-tin oxide can be used as working electrodes. The electrochemical polymerization is carried out via cyclic voltammetry typically performed between −200 mV and +200 mV (versus Ag/Ag+ reference electrode). At the first cycle, the oxidation will be observed, due to oxidation of thiophene and fluorene, respectively. At the following cycles, reversible oxidation and reduction will be observed at around +1000 mV and +1200 mV, and the change in color of the material on the electrode will also be observed. After the polymerization is completed, the electrodes are rinsed with toluene, to remove any unpolymerized precursor polymers. A thin film of a reddish material will remain on the electrode surface. This thin film should exhibit an absorbency spectra that has the combined characteristics of poly (thiophen-2,5diyl) and poly(fluoren-1,7diyl).

Figure 9:
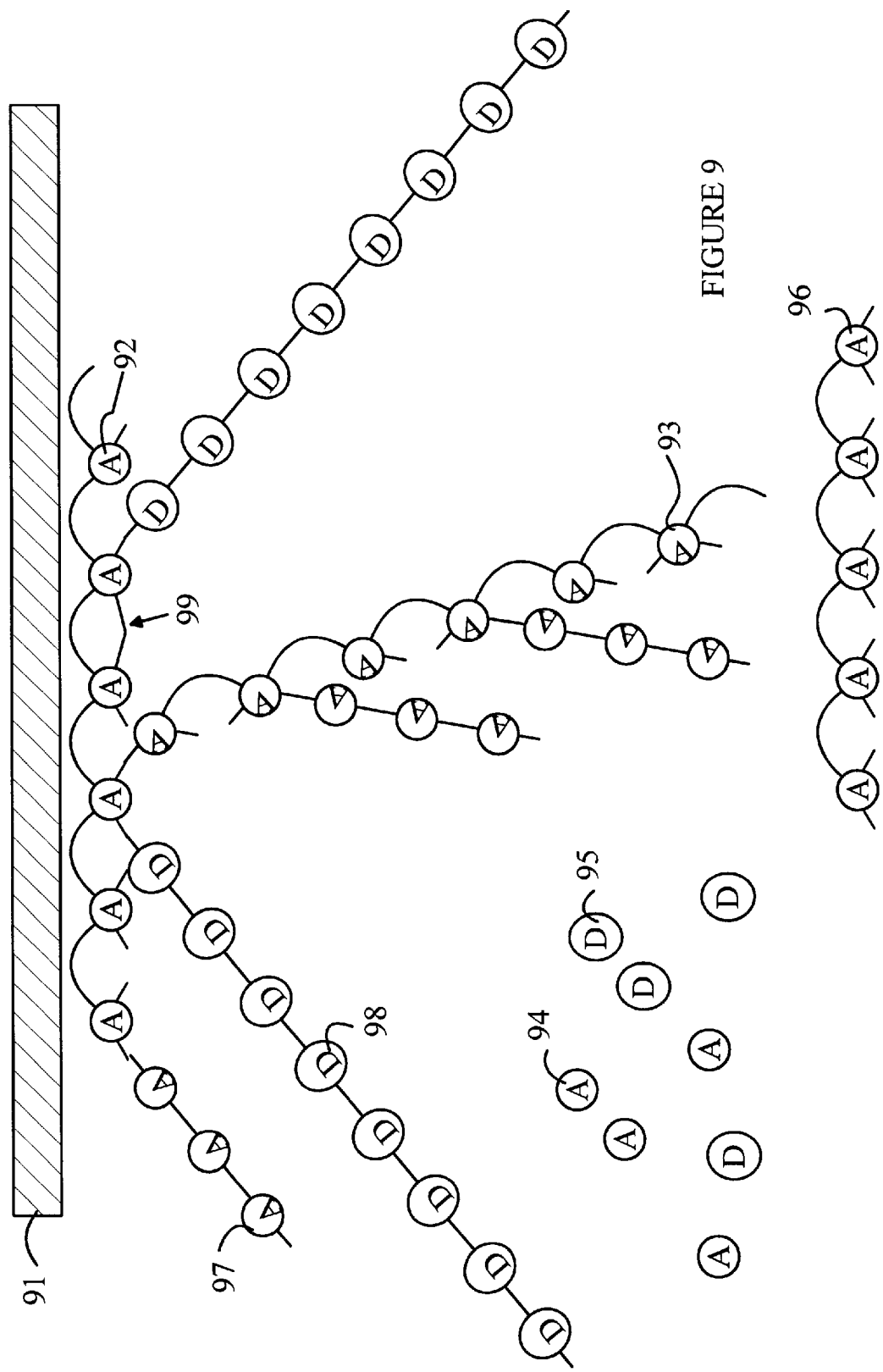
FIG. 9 illustrates the various types of chemical structures that are obtained when a solution having precursor polymers and various monomers is electrochemical polymerized.

It should be noted that the precursor polymers described above may also be used as "seed" polymers for growing additional electroluminescent chains. It has been found experimentally that the seed polymers may be mixed with the monomers used to form the precursor as well as other monomers that have only electrochemical polymerization active sites. Refer now to FIG. 9, which illustrates the various types of chemical structures that are obtained when a solution having precursor polymers and various monomers is electrochemical polymerized on an electrode 91. In this example, the precursor polymers are constructed from a monomeric unit A, an exemplary precursor polymer being shown at 96. Two types of monomers are assumed to be present in the solution, monomers of type A as shown at 94 and monomers of type D shown at 95. For example, the D monomers may be dyes that determine the emission characteristics of the spectral lines emitted by the final electroluminescent layer that is deposited on electrode 91.

As noted above, the precursors form an insoluble material by forming bonds between adjacent A's in the precursor such as shown at 99 and by cross-linking two precursor polymers such as precursor polymers 92 and 93. The various monomers can be electrochemical polymerized onto any of the open active sites on the precursor polymers that permit such polymerization. Once a monomer has bonded to a precursor polymer, it can provide the starting point for a chain of monomers such as shown at 97 and 98.

A high quality electrically conduction and/or electroluminescent layer can be obtained in this manner with a relatively low percentage of precursor polymers. It has been found experimentally that precursor polymer concentrations as low as 1% can provide high quality films in the presence of 99% monomers. For example, a high quality conducting film was deposited in this manner by the electrochemical poymerization of a solution having 100 Moles of oxlylthiophene per mole of the repeating unit in the polybinyl carbozole The films generated by the electrochemical polymerization of the precursor polymers in the presence of the monomer have two advantages over films obtained by the electrochemical polymerization of just precursor polymers. First, the resultant polymer can have a higher density of electroactive active sites than that obtained without including the monomer units, and hence, provides superior light output. Films may be deposited with as little as 0.01% precursor polymer and 99.99% monomer. Second, the cost of the film is substantially reduced, since the cost of making the precursor can be quite high.

It should be noted that the film can be deposited in two steps. In the first step, the precursor polymers are deposited via electrochemical polymerization forming a three-dimensional mesh. In the second step, the monomers, including any dyes are deposited by electrochemical polymerization on the precursor mesh. In this embodiment of the present invention, the surface with the precursor deposited film can be provided as a starting material that is customized for a particular application by second electrochemical polymerization.

Figure 10:
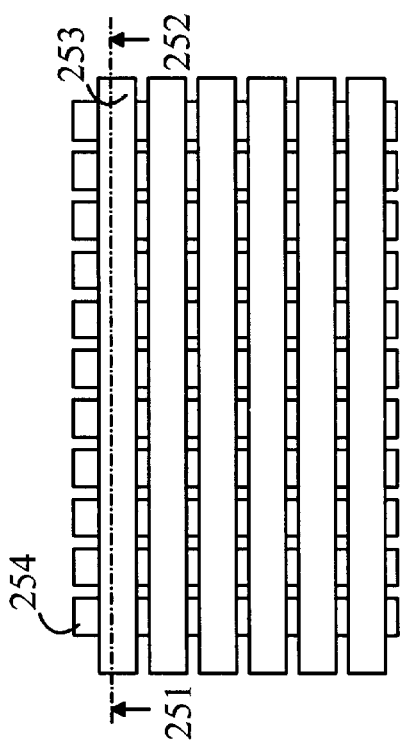
FIG. 10 is a top view of a display according to the present invention.
Figure 11:
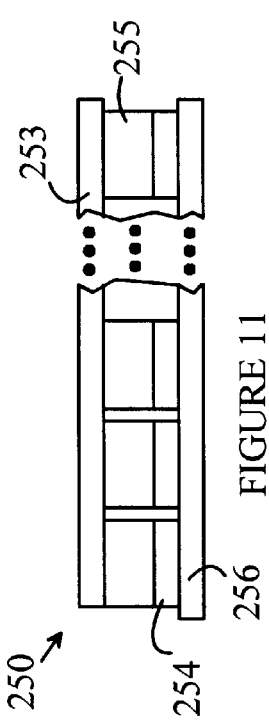
FIG. 11 is a cross-sectional view of the display shown in FIG. 10 through line 251–252.

The precursor polymers of the present invention are well suited for constructing multi-color displays such as the pixelated display shown in FIGS. 10 and 11. FIG. 10 is a top view of a display 250, and FIG. 11 is a cross-sectional of display 250 view through line 251–252. Display 250 is composed of a number of pixels arranged in a rectangular array having rows and columns defined by horizontal electrodes and vertical electrodes. An exemplary horizontal electrode is shown at 253, and an exemplary vertical electrode is shown at 254. An electroluminescent polymer 255 is sandwiched between the horizontal and vertical electrodes at each intersection point. An individual pixel is activated by applying a voltage between the row and column electrodes that define that pixel. In the example shown in FIGS. 10–11, the vertical electrodes are deposited on a substrate 256 by patterning a conducting layer that is deposited on the substrate.

Figure 14:
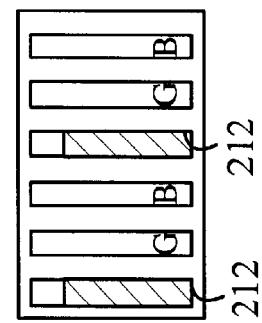
FIGS. 12–14 are top views of a display 200 at various stages in the fabrication process.
Figure 13:
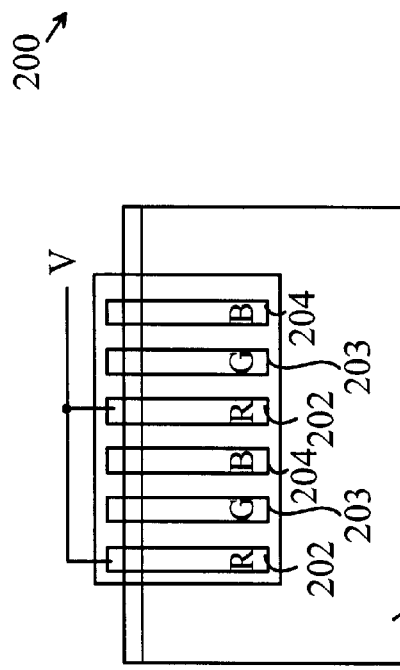
Figure 12:
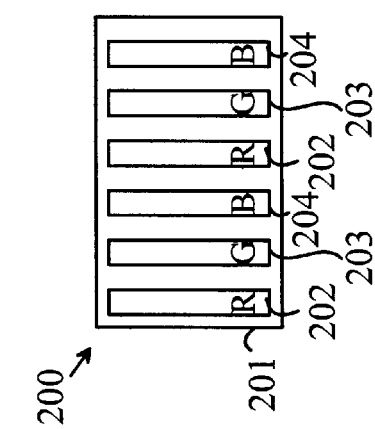

The manner in which the precursors of the present invention are used to construct a pixelated multi-colored display such as that shown in FIGS. 10–11 may be more easily understood with reference to FIGS. 12–14, which are top views of a display 200 at various stages in the fabrication process. In this example, the display is constructed from red, blue, and green pixels that are addressed by the row-column addressing scheme discussed above. To simplify the following discussion, it will be assumed that each pixel consists of an electroluminescent polymer layer sandwiched between the two electrodes. The pixels are fabricated on the column electrodes by depositing the electroluminescent polymer layers constructed from precursors according to the present invention for the various colors on the corresponding column electrodes electrodes. The row electrodes are then deposited. For the purposes of this discussion, it will be assumed that the column electrodes have already been patterned on a substrate 201 as shown in FIG. 12. For example, the column electrodes can be patterned from indium tin oxide that is lithographically patterned on a glass substrate. It will also be assumed that any additional layers such as an electron transport layer that are common to all pixels have also been deposited.

The deposition of the electroluminescent material is carried out in three separate electrochemical deposition steps, one for each color. The column electrodes that are to receive the red, green, and blue-emitting materials are shown at 202–204, respectively. The red-emitting polymer layer is deposited by connecting all of the red columns 202 together and placing the substrate in a deposition bath 210 that contains the precursor polymers and dyes for the red-emitting layer as shown in FIG. 12. The precursors and monomers are polymerized as discussed above. During the deposition of the red polymer, the green and blue columns are not energized; hence, material is only deposited on the red columns 202. At the end of the deposition process, the red-emitting columns are coated with a polymer film 212 as shown in FIG. 11.

The process is then repeated by connecting columns 203 together and utilizing an electrochemical bath having the precursor polymers and dyes for the green-emitting layer. Finally, the process is repeated by connecting columns 204 together and utilizing an electrochemical bath having the precursor polymers and dyes for the blue-emitting layer.

It should be noted that the column electrodes can be patterned such that all of the electrodes that are to receive a particular color are connected by bus lines that run over a portion of the substrate that is not utilized in the final display. These bus lines can then be removed after the electrochemical deposition is complete by removing that portion of the substrate or by breaking the connections. For example, the traces can be broken by laser ablation of the indium tin oxide in selected areas.

The thickness of the film determines both the final light output of the device and, to some extent, the color of the emitted light. In the present invention, the thickness of the deposited film can be controlled for each film layer by monitoring the thickness during deposition by optical measurements such as low coherence reflectometry or by observing the current flowing through the electrode during the deposition. In addition, the deposition system can be calibrated by using different deposition times and then measuring the light output of the resulting devices.

The above-described embodiments of the present invention refer to a light-emitting device consisting of an electroluminescent layer sandwiched between two metallic electrodes. Light emitting devices that include additional layers between the electroluminescent layer and the metallic electrodes are well known in the art. The additional layers improve the efficiency of hole and electron injection into the electroluminescent layer. In general, the same hole transport and electron transport materials are utilized for all pixels independent of the color emitted by the pixel. Accordingly, these materials may be viewed as being part of the "electrodes". For example, a layer of hole transport material may patterned with the indium tin oxide prior to the various electroluminescent layers being electrochemically deposited as described above. Accordingly, the term electrode as used herein refers both to the metallic electrodes and any transport layers that are common to all pixels and applied over those electrodes.

Various modifications to the present invention will become apparent to those skilled in the art from the foregoing description and accompanying drawings. Accordingly, the present invention is to be limited solely by the scope of the following claims.

What is claimed is:

1. A method for fabricating a display device, said method comprising the steps of:

providing an electrode layer comprising a plurality of electrodes on a substrate;

immersing said electrode layer in a solution of a first precursor polymer in a first solvent, said first precursor polymer comprising a plurality of electrochemical polymerizable monomers, each monomer having first and second polymer-forming active sites that can be joined by electrochemical polymerization and third and fourth polymer-forming active sites that can be joined chemically in solution, said first precursor polymer being soluble in said first solvent whereas a polymer formed by electrochemical polymerization of said first and second polymer-forming active sites is insoluble in said first solvent; and connecting a first one of said electrodes to an electric circuit while leaving the others of said electrodes disconnected from said circuit, said circuit applying a potential to said electrode sufficient to cause said first and second polymer active sites to polymerize by electrochemical polymerization thereby depositing a first polymer layer comprising said first polymer precursor on said first one of said electrodes; and depositing a second electrode layer over said first polymer layer.

2. The method of claim 1 further comprising the steps of:

immersing said electrode layer in a solution of a second precursor polymer in a second solvent, said second precursor polymer comprising a plurality of electrochemical polymerizable monomers, each monomer having first and second polymer-forming active sites that can be joined by electrochemical polymerization and third and fourth polymer-forming active sites that can be joined chemically in solution, said second precursor polymer being soluble in said second solvent whereas a polymer formed by electrochemical polymerization of said first and second polymer-forming active sites is insoluble in said second solvent; and connecting a second one of said electrodes to an electric circuit while leaving the others of said electrodes disconnected from said circuit, said circuit applying a potential to said electrode sufficient to cause said first and second polymer active sites to polymerize by electrochemical polymerization thereby depositing a polymer comprising said first polymer precursor on said second one of said electrodes.

3. The method of claim 1 wherein said monomer comprises fluorene, triophene, pyrrol, biphenyl, poly(vinyl carbazole) or poly (vinyl oxy thiophene).

4. The method of claim 1 wherein said monomer comprises a dimer constructed from two compounds selected from the group consisting of fluorene, triophene, pyrrol, biphenyl, poly(vinyl carbazole) and poly (vinyl oxy thiophene).

5. The method of claim 1 further comprising a spacer group bonded to one of said first or second active sites.

6. The method of claim 5 wherein said spacer group comprises $(CH_2)_n$, $(OCH_2)_n$, or $(OCH_2CH_2)_n$, where $1<n<20$.

7. The method of claim 1 wherein said electrochemical polymerizable monomers comprise first and second chemical species.

8. The method of claim 7 wherein said first and second chemical species occur randomly within said precursor polymer.

9. The method of claim 7 wherein said precursor polymer comprises regions having a plurality of monomers of said first species coupled to each other to form a co-polymer.

10. The method of claim 1 wherein said solution further comprises non-polymerized monomers.

11. The method of claim 10 wherein the concentration of said monomers by molar percent of monomeric repeat unit of polymer is between 0.01 and 99.99%.

12. A display device comprising a plurality of pixels, wherein a first one of said pixels comprises a first electrode, a layer of a first electroluminescent material, and a second electrode, said layer of said first electroluminescent material comprising a first polymer that emits light in response to holes and electrons combining therein, said polymer comprising a first precursor polymer comprising a plurality of electrochemical polymerizable monomers, each monomer having first and second polymer-forming active sites that can be joined by electrochemical polymerization and third and fourth polymer-forming active sites that can be joined chemically in solution, said first precursor polymer being soluble in a first solvent whereas a polymer formed by electrochemical polymerization of said first and second polymer-forming active sites is insoluble in said first solvent, wherein said first precursor polymer comprises said monomers joined by said third and fourth polymer-forming active sites, said first polymer comprising at least two of said first precursor polymers linked by said first and second polymer-forming active sites on monomers in those first precursor polymers.

13. The display of claim 12 wherein a second one of said pixels comprises a third electrode, a layer of a second electroluminescent material, and a fourth electrode, said layer of said second electroluminescent material comprising a second polymer that emits light in response to holes and electrons combining therein, said emitted light being of a different wavelength than said light emitted by said first electroluminescent material, said second polymer comprising a second precursor polymer comprising a plurality of electrochemical polymerizable monomers, each monomer having first and second polymer-forming active sites that can be joined by electrochemical polymerization and third and fourth polymer-forming active sites that can be joined chemically in solution, said second precursor polymer being soluble in a second solvent whereas a polymer formed by electrochemical polymerization of said first and second polymer-forming active sites is insoluble in said second solvent, wherein said second precursor polymer comprises said monomers joined by said third and fourth polymer-forming active sites, said second polymer comprising at least two of said second precursor polymers linked by said first and second polymer-forming active sites on monomers in those second precursor polymers.

* * * * *